United States Patent [19]

Garner et al.

[11] Patent Number: 4,515,826

[45] Date of Patent: May 7, 1985

[54] METHOD OF PRODUCTION OF DIELECTRIC INSULATION LAYERS UPON ELECTRICAL CONDUCTORS

[75] Inventors: John N. Garner, Kingston; Michael A. Shannon, Glenburnie, both of Canada

[73] Assignee: Northern Telecom Limited, Montreal, Canada

[21] Appl. No.: 597,394

[22] Filed: Apr. 6, 1984

[51] Int. Cl.³ .............................................. B05D 3/14
[52] U.S. Cl. ........................................ 427/8; 427/47; 427/117; 427/128; 427/130
[58] Field of Search ................. 427/8, 47, 128, 130, 427/117

Primary Examiner—Bernard D. Pianalto
Attorney, Agent, or Firm—R. J. Austin

[57] ABSTRACT

Method of monitoring net magnetic bipolar orientation of magnetically permeable particles in a dry dielectric carrier layer around an electrical conductor by passing the layer covered conductor through a magnetic field to cause particle orientation to affect the magnetic flux strength in the field. Electromotive force or current induced in a sensing conductor placed in the field is affected by the flux strength of the field. Sensing any change in this induced property indicates a change in the net magnetic bipolar orientation.

8 Claims, 4 Drawing Figures

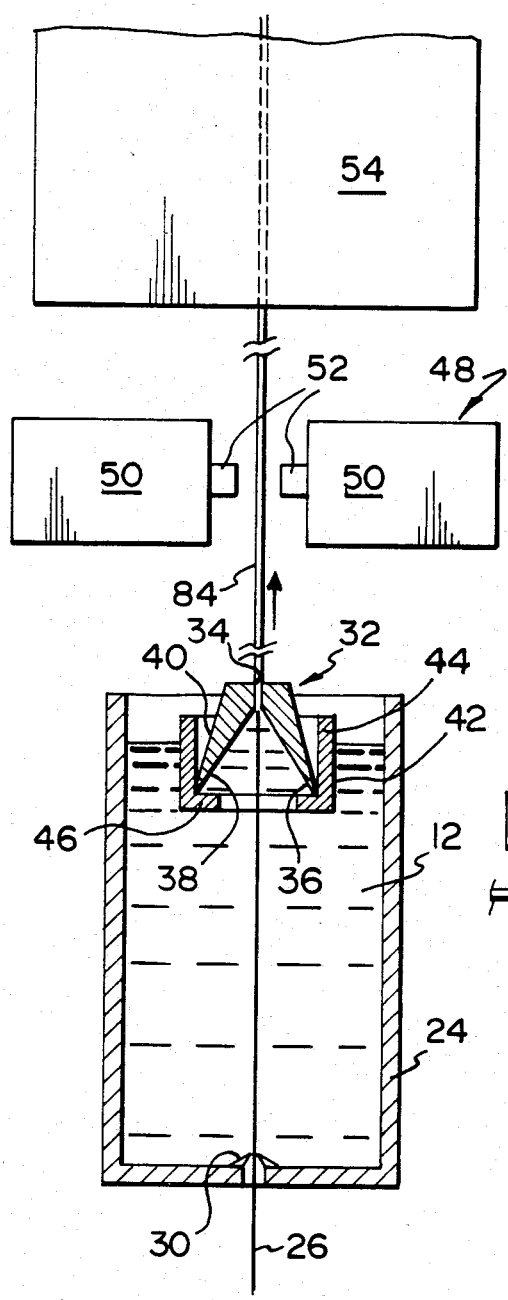
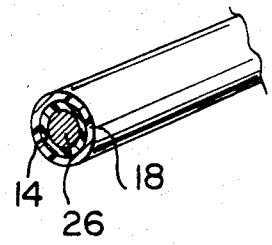
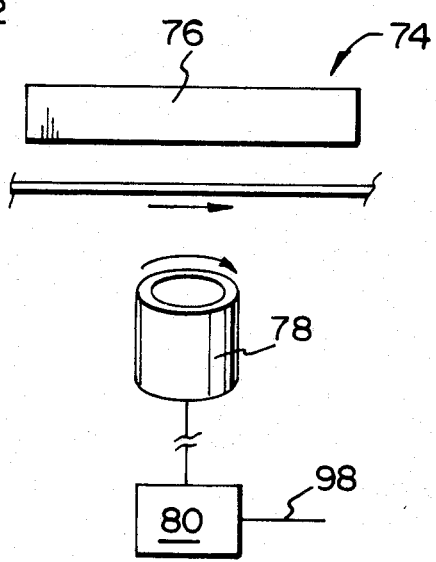
FIG. 2
FIG. 4
FIG. 3

METHOD OF PRODUCTION OF DIELECTRIC INSULATION LAYERS UPON ELECTRICAL CONDUCTORS

This invention relates to the production of dielectric insulation layers upon electrical conductors.

In the telecommunications cable industry, it is common practice to surround each electrical conductor with at least one layer of dielectric material which effects the electrical performance of the conductor, e.g. by producing a desired dielectric effect and helping to provide other design characteristics such as mutual capacitance between conductors. Inductive effect is also an important consideration and, for various reasons, continuous inductive loadings have been proposed and used in dielectric layers of electrical conductors in the telecommunications industry. These continuous inductive loadings have comprised discrete particles of magnetically permeable material, such as ferrite, which are dispersed throughout a dielectric carrier material such as a polymeric substance, e.g. polyethelene or polyvinylchloride. Dielectric layers containing particles of magnetically permeable material will be referred to in this specification as "continuous loaded layers". There are various problems which need to be overcome if electrical conductors having such continuous loaded layers are to produce consistently the electrical characteristics for which they are designed. One of these problems concerns the orientation of the particles in the continuous loaded layer. In order to obtain a desired continuous inductive loading, the quantities of the particles need to be carefully controlled in the layer and the layer should have been formed from a homogeneous mixture of a fluid dielectric carrier and the particles. In addition to this, the orientation of the particles has a great effect upon the final inductive loading. Thus, a continuous loaded layer may carry permeable particles in constant quantities per unit length of the conductor with the particles dispersed evenly throughout the layer, but, the net magnetic bipolar orientation of the particles themselves may change along the length of the conductor, so as to vary the continuous inductive loading. Such a state of affairs is undesirable.

The present invention is concerned with a method and apparatus for monitoring the net magnetic bipolar orientation of the particles in a dry dielectric carrier layer (i.e. a continuous loaded layer) and for controlling between predetermined limits the net magnetic bipolar orientation of these particles.

Accordingly, the present invention provides a method of monitoring net magnetic bipolar orientation of magnetically permeable particles in a dry dielectric carrier layer surrounding an electrical conductor comprising passing the conductor carrying the layer through a magnetic field to cause the net magnetic bipolar orientation of the particles to affect the magnetic flux strength in at least one certain part of the field; and inducing an electrical property in a sensing conductor placed in said certain part of the field, and sensing with said sensing conductor any change in the value of the electrical property, said change corresponding to a change in the net magnetic bipolar orientation of the particles which affect the flux strength in said certain part of the field.

In a preferred method, the sensing conductor moves continuously in said certain part of the field and preferably the conductor is in the form of conductor windings to provide a coil which rotates in the field.

The electrical property which is measured may be either the induced electromotive force or the induced current in the sensing conductor.

The invention also covers a method of controlling between predetermined limits, the net magnetic bipolar orientation of magnetically permeable particles in a dry dielectric carrier layer surrounding an electrical conductor comprising coating the conductor with the layer of a controlled thickness and in fluid form as a composite mixture of fluid carrier material and the particles; passing the conductor through a first magnetic field to orient the particles towards a specific direction relative to the conductor; drying the layer; passing the conductor carrying the layer through a second magnetic field to cause the net magnetic bipolar orientation of the particles to affect the magnetic flux strength in at least one certain part of the second field; inducing an electrical property in a sensing conductor placed in said certain part of the second field; sensing with said sensing conductor any change in the value of the electrical property, said change corresponding to a change in the net magnetic bipolar orientation of the particles which affect the strength in said certain part of the second field; producing electrical signals corresponding to the sensed values of the electrical property and evaluating these signals; and controlling the strength of the first magnetic field dependent upon the evaluated signals to effect the degree of net magnetic bipolar orientation of the particles towards that desired as they pass through the first field.

The invention further includes an apparatus for monitoring net magnetic bipolar orientation of magnetically permeable particles in a dry dielectric carrier layer surrounding an electrical conductor comprising means to pass the conductor carrying the layer along a feedpath; means disposed at one side of one position along the feedpath to create a magnetic field extending across said one part of the feedpath to enable the magnetic flux strength of the field to be affected in at least one certain part of the field by the particles in the layer on the conductor on said one part of the feedpath; and a sensing conductor placed to be in said certain part of the field and have induced therein an electrical property, the sensing conductor capable of sensing change in value of said property, said change corresponding to a change in the net magnetic bipolar orientation of the particles which affect the flux strength in said certain part of the field.

Also provided is an apparatus for controlling between predetermined limits the net magnetic bipolar orientation of magnetically permeable particles in a dry dielectric carrier layer surrounding an electrical conductor comprising means for coating the conductor with a layer of a fluid mixture of fluid carrier material and magnetically permeable particles, and for providing a net magnetic bipolar orientation of the particles towards a single direction; means for drying the layer; apparatus for monitoring net magnetic bipolar orientation of the particles according to the invention defined above and capable of producing signals corresponding to the sensed values of the electrical property; and evaluating and control means for evaluating the signals and for controlling current supplied to the means for providing the net orientation means dependent upon evaluated signals so as to affect the strength of a magnetic field produced thereby and thus affect the degree of net magnetic bipolar orientation towards that desired.

BRIEF DESCRIPTION OF THE DRAWING

One embodiment of the invention will now be described by way of example with reference to the accompanying drawings, in which:

FIG. 2 is a side elevational view partly in cross-section of a coating and magnetic field particle orientating means of the apparatus and on a larger scale than in FIG. 1;

FIG. 3 is a side elevational view of apparatus for monitoring the net inherent orientation of magnetically permeable particles in a carrier layer on the conductor; and FIG. 4 is an isometric view of an insulated conductor.

DETAILED DESCRIPTION OF THE DRAWING

Figure 1:
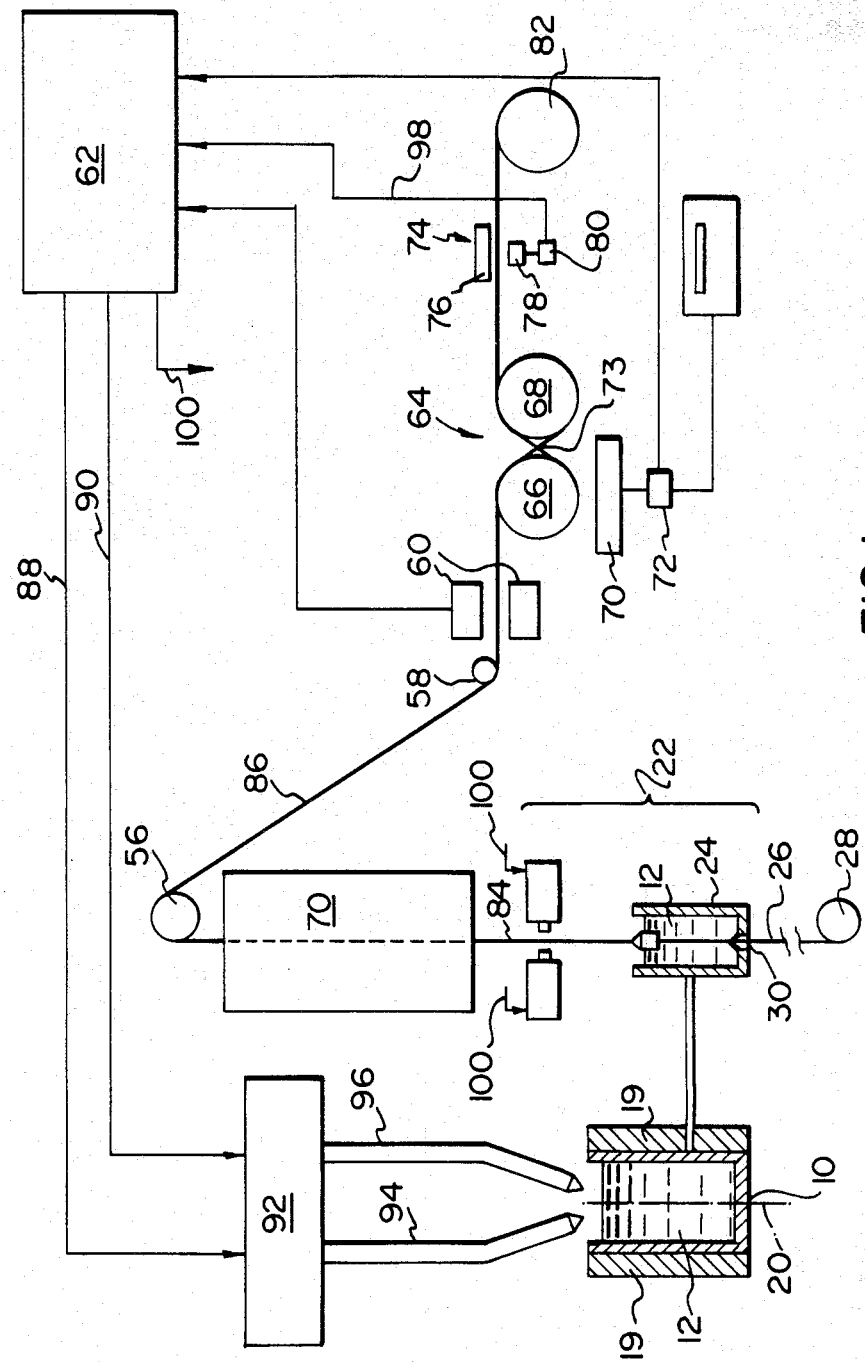
FIG. 1 is a diagrammatic side elevational view of an apparatus for controlling the orientation of particles in a dry carrier layer surrounding a conductor.

As shown on the left hand side of FIG. 1, the apparatus comprises a mixing container 10 for providing a homogeneous mixture 12 of a fluid dielectric carrier incorporating a quantity of magnetically permeable particles. The dielectric carrier may be a latex emulsion or a polymeric material, e.g. polyethelene or polyvinylchloride. The magnetically permeable particles comprise ferrite particles. The mixture is to be used in such a way as to provide an inner continuous loaded layer 14 surrounding a conductor 26 (see FIG. 4) and in turn surrounded by an outer layer 18 of a polymeric insulating material. The mixture is preferably maintained in a homogeneous condition by the method and apparatus described in a copending patent application entitled "Maintaining Homogeneity in a Mixture" in the names of J. H. Walling, M. A. Shannon and G. Arbuthnot and filed concurrently with this application (U.S. Application Ser. No. 597,603). In the aforementioned specification, the homogeneity is achieved within the tank 10 by subjecting the mixture to a magnetic field which is rotating around the tank and which at any instant is centred about an axis lying outside the tank and extending in a circumferential sense of the tank, so as to be inclined relative to the tank axis. This is achieved in this embodiment and as described in the aforementioned specification by the use of three coils 19 (two of which are shown in section) the coils circumferentially extending around the tank and lying side by side in the circumferential sense. Each coil has its axis inclined to the axis 20 of the container 10 in the manner described in the aforementioned specification.

The apparatus also includes a coating and magnetic field particle orienting means identified collectively as item 22 in FIG. 1. The means 22 comprises an application container 24 to which the mixture 12 is fed for applying it to the conductor 26 as the conductor is fed upwardly from a give-up spool or reel 28 and through a sealed orifice 30 in the base of the reservoir 24. The structure of the reservoir 24 and associated die means is as described in an application entitled "Production of Insulated Electrical Conductors" filed concurrently with this application in the names of J. H. Walling, M. A. Shannon and G. Arbuthnot (U.S. application Ser. No. 597,381). As described in that application, a wiping die 32 (see FIG. 2) formed with a die aperture 34 is freely movably floating upon the mixture within the reservoir 24. The fluid thus provides a supporting fluid force means for the die as it holds the die means in a certain vertical position. As shown by FIG. 2, the die is of frustoconical shape, tapering towards its upper end, and has a lower annular edge 36 formed between inner and outer converging frustoconical surfaces 38 and 40. The die is supported upon a flotation collar 42 with an upstanding cylindrical wall 44 and a lower horizontal flange 46, the edge 36 carried in a corner formed between the flange and the wall. As shown, the wall 44 projects above the upper surface of the mixture 12 and this prevents the fluid from flowing inside the wall and from contacting the outer surface 40 of the die, so as to maintain the floating relationship of the die within the fluid. Also as shown the die orifice 34 projects above the surface of the fluid. The die is of a material sufficiently hard to resist erosion by contact with the ferrite material in the fluid. Such a material is a ceramic material, e.g., Henium, manufactured by Heney Die Corporation. Other suitable materials include a diamond die insert.

The means 22 also comprises a magnetic field producing means 48 for orienting the magnetically permeable particles in the fluid layer provided upon conductor (as will be described) towards a particular direction. This means 48 comprises two solenoids 50 (see FIG. 2) each having a soft iron core 52 disposed within a coil of the solenoid. The solenoids are disposed with their north and south poles facing each other across the feedpath for the conductor, whereby the solenoids operate to create intensity in the magnetic field across the feedpath.

Located above the means 22 is a drying oven 54 through which the conductor coated with the continuous loaded layer in a fluid state is passed so as to dry that layer into the condition shown in FIG. 4.

The conductor flow path then extends around guide rollers 56 and 58 (see FIG. 1) and then through a diameter scanning device 60. This device may be a laser or electronic eye device for determining the diameter of the outside of the insulation on the conductor. A signal is sent from the device 60 to a microprocessor 62 to indicate the diameter of the conductor and to be used to provide an evaluated signal together with other signals as will be described.

From the diameter scanning device the conductor then moves along its pass line and through a means 64 for monitoring the quantity of particles per unit length of the carrier layer surrounding the conductor as the conductor moves along. The monitoring means is constructed in the manner described in a copending patent application entitled "Production of Dielectric Insulation Layers Upon Electrical Conductors" (U.S. application Ser. No. 997,393), filed concurrently with this application in the names of M. A. Shannon and R. J. Howat.

As described in the specification entitled "Production of Dielectric Insulation Layers Upon Electrical Conductors", the monitoring means 64 comprises two axially parallel and spaced apart cylinders 66 and 68 which provide a restraining means for preventing conductor from moving towards a magnet means in the form of a permanent magnet 70, which is disposed radially outwards from a sector of one of the cylinders, namely cylinder 66. The magnet 70 is connected to a transducer 72. As described in detail in the aforementioned specification and as shown in FIG. 1 of this application, the coated conductor passes around part of each cylinder 66 and 68 on a number of passes while moving from one cylinder to another at a crossover point 73. The two cylinders thereby act as a capstan to assist in drawing of the coated conductor through the apparatus. As the conductor is passed in successive wrappings around the cylinder 66, it is maintained along its path in contact with the cylinder by the tension on the conductor. The magnet 70 is movable towards and away from the cylinder and its position is dependent upon the amount of particles of magnetically permeable material in the lengths of conductor which are passing around the cylinder 66 in the parts of all the windings which lie closest to the magnet means, and which therefore lie within the magnetic field created. Thus, if the particles moving in the conductor around the cylinder 66 tend to increase or decrease, then the magnet will move respectively towards or away from the cylinder 66. The degree of this movement is recognized by the transducer 72 which provides an electrical signal which it transmits to the microprocessor 62 and the strength of this signal corresponds to the quantity of magnetically permeable particles in the length of conductor passing through the means 64.

Downstream along the pass line for the conductor from the means 64 is located an apparatus 74 for monitoring net magnetic bipolar orientation of magnetically permeable particles in the carrier layer. As shown particularly by FIG. 3, the means for monitoring the orientation of particles comprises a means disposed at one side of one position along the feedpath to create a magnetic field extending across one part of the feedpath. This particular means is a permanent magnet 76 which extends alongside the flow path as shown by FIG. 3 with its poles spaced along the flow path direction. Alternatively, the means to create a magnetic field may be an electromagnet.

The monitoring means also includes a sensing conductor placed on the other side of the feedpath from the magnet 76 in a position so as to be lying in part of the magnetic field produced by the magnet and which is affected by the presence of the particles in the continuous loaded layer as the conductor moves along the feedpath. This conductor is in the form of conductor windings to form a coil 78 (see particularly, FIG. 3). In order for the conductor to cut through the magnetic flux lines, the coil is rotatable about its main axis by drive means (not shown). The coil 78 is connected to a transducer 80 which registers induced electromotive force in the coil 78 during its rotation and transmits to the microprocessor 62 an electrical signal corresponding to this induced force.

In addition, the apparatus 74 is rotatable as a unit around the feedpath of the conductor with the magnet 76, coil 78 and transducer maintained in their relative positions. Rotation is provided to enable the coil to sense, in continuous fashion, field strengths in different positions around the conductor so as to determine, more exactly, the orientation of the particles.

After passing through the orientation monitoring apparatus 74, the conductor then passes around a take-up roll 82 which is driven and provides means for passing the conductor along the feedpath which has been described.

In use of the apparatus and with particular reference to FIG. 1, the mixture 12 of the fluid carrier and the particles is maintained in a homogeneous state by the rotating field around the container 10 by energizing the coils 19. The mixture is then fed through to the tank 24 and the conductor 26 is passed upwardly through the seal 30 from the give-up reel 28 to pass through the mixture. The coated conductor then passes upwardly through the die means 40 as described more fully in the above referred to copending application entitled "Production of Insulated Electrical Conductors" (U.S. application Ser. No. 597,394). Because the conductor is unsupported between the give-up reel 28 and the guide pulley 56, there is a tendency for it to wander slightly laterally of its intended path during its vertical ascent. To prevent the fluid coating on the conductor from being eccentrically disposed because of this wandering, the die means 40 is allowed to move sideways by its floating disposition upon the mixture 24 and the conductor in passing through the die orifice 34 moves the die means 40 laterally with it. The movement of the die corresponds closely to the lateral movement of the conductor and is controlled and ensured by the hydrodynamic forces which exist between the conductor and the surfaces of the die as these forces are consistently balanced during drawing of the conductor through the die orifice. As discussed in the aforementioned specification, this is a naturally occurring balance which is not upset by the wandering conductor if as in this case, the die is also allowed to wander across the fluid. Thus, the adjustment of the die relative to the fluid to maintain the concentricity is automatic and eccentricity of the coating is substantially negligible with this apparatus.

The coated conductor 84 then proceeds upwardly through the magnetic field created by the solenoids 50 which operate in the manner described in the copending application entitled "Insulated Electrical Conductor" (U.S. application Ser. No. 597,647) referred to above. As the conductor leaves the die means the particles are disposed randomly in direction throughout the coating. However, upon passing through the electromagnetic field created by the solenoids, the bipolar orientation of the particles is influenced by the field which tends to turn the bipolar orientation towards a single direction dictated by the field to give a net bipolar orientation for all of the particles in the coating. This control in orientation is provided to give a constancy in the magnetic properties of the particles in the finished continuous loaded layer.

The coated conductor with the oriented particles then proceeds through the drying oven 70 and the dry coated conductor 86 carrying its finished continuous loaded layer (i.e. the coating of dried dielectric carrier material carrying the particles, proceeds onwardly along its feedpath. The continuously loaded layer conductor then passes through the diameter scanner 60 and through the monitoring apparatus 64. As described in the aforementioned application entitled "Production of Dielectric Insulation Layers Upon Electrical Conductors" (U.S. application Ser. No. 997,393), as the conductor is passed in successive wrappings around the cylinder 66, the magnet means 70 moves towards and away from the cylinder dependent upon the amount of particles of magnetically permeable material in the lengths of conductor which are passing around the cylinder in the parts of all the windings which lie closest to the magnet and which therefore lie in the magnetic field created. The movement of the magnet is against the resistance of the transducer 72 which sends signals to the microprocessor 62, these signals corresponding to the movement of the magnet and thus to the quantity of particles in the material passing around the cylinder 66. The signal is compared by the microprocessor with the datum signal corresponding to the desired quantity of particles per unit length of conductor. Any difference in the signals results in the microprocessor sending a message along a feedback loop 88 and 90 to control a material dispenser 92 for the purpose of varying the amount of material dispensed through outlets 94 and 96, to adjust the quantity of particles in the mixture and correspondingly to adjust the quantity of particles per unit length towards that desired. The message sent by the microprocessor is partially influenced by a signal received from the diameter scanner device 98.

After passage through the monitoring device 64, the continuously loaded layer conductor 86 then moves through the monitoring device 74. The permanent magnet 76 provides a magnetic field which passes across the feedpath of the conductor and also includes within its range the rotating coil 78. The field strength is less than 100 gauss, but should be sufficient to offset any ambient field generated by the earth. As the conductor passes along the feedpath, the orientation of the particles in the loaded layer affects the magnetic flux strength in the part of the magnetic field occupied by the conductor and also occupied by the coil 78. As the coil 78 rotates, it has an electromotive force induced in it and which is affected by the flux lines through which the coil rotates. Thus the strength of the electromotive force is dependent upon the influence that the direction of orientation of the particles has upon the field. This strength is thus a measurement of the net bipolar orientation of the particles. The electromotive force acts upon transducer 80 to transmit a signal along the loop 98 to the microprocessor, which then evaluates the signal against a datum signal corresponding to the desired bipolar orientation of the particles. This evaluation is also made with the monitor signals received from the transducer 70 and the diameter measuring signals and the diameter scanning device to provide evaluated signals of the orientation of the particles per unit quantity of particles and this evaluated signal is fed along loops 100 to the solenoids 50, so as to change the position of the cores of the solenoids and thus the strength of the magnetic field which effects the orientation of the particles in the fluid layer. The strength of this magnetic field is controlled by the evaluated signals from the microprocessor to ensure that the net bipolar orientation of the particles is maintained between predetermined limits and is dependent upon the measurements taken as described above, i.e. upon the signals transmitted to the microprocessor.

What is claimed is:

1. A method of monitoring net inherent bipolar orientation of magnetically permeable particles in a dry dielectric carrier layer surrounding an electrical conductor comprising:
passing the conductor carrying the layer through a magnetic field to cause the orientation of the particles to affect the magnetic flux strength in at least one certain part of the field; and
inducing an electrical property in a sensing conductor placed in said certain part of the field, and sensing with said sensing conductor any change in the value of the electrical property, said change corresponding to a change in the net orientation of the particles which affect the flux strength in said certain part of the field.

2. A method according to claim 1, comprising moving the sensing conductor continuously in said certain part of the field to cut through the magnetic flux lines thereby to induce the electrical property in the sensing conductor.

3. A method according to claim 1, comprising providing a sensing conductor comprising conductor windings to form a coil and rotating the coil in said certain part of the field so that the windings cut through the magnetic flux lines thereby to induce the electrical property in the sensing conductor.

4. A method according to claim 1, wherein the sensing conductor senses the property of electromotive force which is induced in it by the magnetic flux strength in said certain part of the field.

5. A method according to claim 1, wherein the sensing conductor senses the property of current which is induced in it by the magnetic flux strength in said certain part of the field.

6. A method according to claim 1, comprising monitoring the quantity of particles per unit length of the carrier layer to produce electrical signals corresponding to monitored quantities of particles, producing electrical signals corresponding to the value of the electrical property induced in the sensing conductor and evaluating these signals to provide evaluated signals which correspond to the net inherent orientation of a unit quantity of particles in the dielectric carrier layer.

7. A method of controlling between predetermined limits the net inherent orientation of magnetically permeable particles in a dry dielectric carrier layer surrounding an electrical conductor comprising:
coating the conductor with the layer of a controlled thickness and in fluid form as a composite mixture of fluid carrier material and the particles;
passing the conductor through a first magnetic field to orient the particles towards a specific direction relative to the conductor either before or after drying the layer;
passing the conductor carrying the layer through a second magnetic field to cause the orientation of the particles to affect the magnetic flux strength in at least one certain part of the second field;
inducing an electrical property in a sensing conductor placed in said certain part of the second field;
sensing with said sensing conductor any change in the value of the electrical property, said change corresponding to a change in the net orientation of the particles which affect the strength in said certain part of the second field;
producing electrical signals corresponding to the sensed values of the electrical property and evaluating these signals; and
controlling the strength of the first magnetic field dependent upon the evaluated signals to affect the degree of orientation of the particles as they pass through the first field, to provide a degree of orientation which is desired.

8. A method according to claim 7 further comprising monitoring the quantity of particles per unit length of the carrier layer to produce electrical signals corresponding to monitored quantities of particles and evaluating these signals together with the signals which correspond to the sensed values of the electrical property to provide evaluated signals and controlling the strength of the first magnetic field dependent upon the evaluated signals.

* * * * *